United States Patent
Qu et al.

(10) Patent No.: US 9,708,726 B2
(45) Date of Patent: Jul. 18, 2017

(54) SILICON WAFER HEAT TREATMENT METHOD

(71) Applicant: SHIN-ETSU HANDOTAI CO., LTD., Tokyo (JP)

(72) Inventors: Wei Feng Qu, Takasaki (JP); Fumio Tahara, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 59 days.

(21) Appl. No.: 14/898,329

(22) PCT Filed: Jun. 26, 2014

(86) PCT No.: PCT/JP2014/003416
§ 371 (c)(1),
(2) Date: Dec. 14, 2015

(87) PCT Pub. No.: WO2015/025448
PCT Pub. Date: Feb. 26, 2015

(65) Prior Publication Data
US 2016/0130718 A1     May 12, 2016

(30) Foreign Application Priority Data

Aug. 23, 2013 (JP) ................................. 2013-173248

(51) Int. Cl.
*C30B 33/02*     (2006.01)
*C30B 1/04*     (2006.01)
(Continued)

(52) U.S. Cl.
CPC ............... *C30B 1/04* (2013.01); *C30B 29/06* (2013.01); *C30B 33/02* (2013.01); *H01L 21/324* (2013.01)

(58) Field of Classification Search
CPC ............ C30B 1/10; C30B 29/06; C30B 33/02
See application file for complete search history.

(56) References Cited

U.S. PATENT DOCUMENTS 4,987,016 A    1/1991   Ohto et al.
7,601,227 B2 *   10/2009   Kusaba ................. C04B 41/009
                                                             134/19
(Continued)

FOREIGN PATENT DOCUMENTS

CN     100390927 C    5/2008
JP      S64-61376 A    3/1989
(Continued)

OTHER PUBLICATIONS

Sep. 30, 2014 International Search Report issued in International Patent Application No. PCT/JP2014/003416.
(Continued)

*Primary Examiner* — Robert M Kunemund
(74) *Attorney, Agent, or Firm* — Oliff PLC

(57) ABSTRACT

A silicon wafer heat treatment method includes: placing a silicon wafer on a SiC jig and into a heat treatment furnace; performing heat treatment on the silicon wafer in the heat treatment furnace in a first non-oxidizing atmosphere; reducing the temperature; and carrying the silicon wafer out of the heat treatment furnace. In the heat reduction step, after the temperature is reduced to the temperature at which the silicon wafer can be carried out of the heat treatment furnace, the first non-oxidizing atmosphere is switched to an atmosphere containing oxygen, an oxide film having a thickness of 1 to 10 nm is formed on the surface of the SiC jig in the atmosphere containing oxygen, and the atmosphere containing oxygen is then switched to a second non-oxidizing atmosphere. A silicon wafer heat treatment method can prevent carbon contamination from a jig and an environment during a heat treatment process.

3 Claims, 2 Drawing Sheets

(51) Int. Cl.
 *C30B 29/06* (2006.01)
 *H01L 21/324* (2006.01)

(56) References Cited

U.S. PATENT DOCUMENTS

| | | | |
|---|---|---|---|
| 2004/0188319 A1 | 9/2004 | Buckley et al. | |
| 2004/0259717 A1* | 12/2004 | Odaka | C04B 35/575 501/87 |
| 2006/0078839 A1* | 4/2006 | Adachi | H01L 21/67103 432/258 |

FOREIGN PATENT DOCUMENTS

| | | |
|---|---|---|
| JP | H10-199948 A | 7/1998 |
| JP | H10-242254 A | 9/1998 |
| JP | 2006-521689 A | 9/2006 |
| JP | 2010-177442 A | 8/2010 |
| WO | 2005/031843 A1 | 4/2005 |

OTHER PUBLICATIONS

Mar. 3, 2017 Office Action issued in Chinese Patent Application No. 201480034727X.

\* cited by examiner

SILICON WAFER HEAT TREATMENT METHOD

TECHNICAL FIELD

The present invention relates to silicon wafer heat treatment methods.

BACKGROUND ART

By performing heat treatment on surface layer defects (COPs) of a silicon wafer in a non-oxidizing atmosphere, the surface layer COPs are eliminated. In the case of high-temperature heat treatment, a SiC jig is often used, and an environment in which a silicon single crystal wafer (hereinafter referred to simply as a silicon wafer) subjected to heat treatment is taken out of something contains oxygen and a carbonation product, which become a source of carbon contamination of the silicon wafer. The silicon wafer contaminated by carbon forms a defect in a device process and causes a leakage current or the like. Moreover, contaminated carbon becomes a carbon donor and becomes a cause of the generation of a Vth (threshold voltage) shift of a device and a device operating failure.

Thus, forming an oxide layer on a silicon wafer as the measures against carbon contamination of the silicon wafer is proposed in Patent Literature 1. However, although. this method is expected to have an effect to some extent as the measures against carbon contamination, the amount of carbon coming out from the SiC jig due to high-temperature oxidation is large and the above measures are not measures to suppress carbon generation itself from the source of carbon contamination, and therefore it is difficult to suppress reliably carbon contamination only with the above measures. Moreover, since a thick oxide film is formed on the front surface of the heat-treated wafer, removal of the oxide film and a polishing process are required. Furthermore, since the oxide film is formed at a high temperature, oxygen is implanted into a wafer surface layer and the defect size of a defect which has not been eliminated in a surface layer portion is increased due to a supply of oxygen, which becomes a cause of degradation of electrical characteristics.

CITATION LIST

Patent Literatures

PATENT LITERATURE 1: JP-A-2010-177442

SUMMARY OF INVENTION

Technical Problem

As described above, an argon heat-treated wafer for the purpose of eliminating surface layer defects (COPs) is contaminated by carbon (for example, contamination at a carbon concentration of 3 to $5 \times 10^{16}$ atoms/cm$^3$ at measurement values by a SIMS (secondary ion mass spectrometer)) from the SiC jig and an environment (a wafer transfer chamber) during heat treatment. Since such carbon contamination affects device characteristics, improvement of carbon contamination is urgently necessary.

The present invention has been made in view of the above-described problem and an object thereof is to provide a silicon wafer heat treatment method that can prevent carbon contamination from a jig and an environment during a heat treatment process.

Solution to Problem

To solve the above-described problem, the present invention provides a silicon wafer heat treatment method including: placing a silicon wafer on a SiC jig and putting the silicon wafer into a heat treatment furnace; performing heat treatment on the silicon wafer in the heat treatment furnace in a first non-oxidizing atmosphere; reducing the temperature to a temperature at which the silicon wafer can be carried out of the heat treatment furnace; and carrying the silicon wafer out of the heat treatment furnace, wherein, in the heat reduction step, after the temperature is reduced to the temperature at which the silicon wafer can be carried out of the heat treatment furnace, the first non-oxidizing atmosphere is switched to an atmosphere containing oxygen, an oxide film having a thickness of 1 to 10 nm is formed on the surface of the SiC jig in the atmosphere containing oxygen, and the atmosphere containing oxygen is then switched to a second non-oxidizing atmosphere.

By using such a heat treatment method, it is possible to prevent release of carbon from the SiC jig itself. As a result, it is possible to prevent carbon contamination of the silicon wafer.

Moreover, the atmosphere containing oxygen may include a first atmosphere containing oxygen and a second atmosphere containing oxygen, the second atmosphere whose oxygen partial pressure is lower than the oxygen partial pressure of the first atmosphere containing oxygen, the first atmosphere containing oxygen is changed into the second atmosphere containing oxygen.

By using such an atmosphere containing oxygen, it is possible to make the oxide film formed on the SiC jig less likely to come off when the atmosphere is switched to the second non-oxidizing atmosphere.

Furthermore, the formation of the oxide film may be performed in the first atmosphere containing oxygen under heat treatment conditions: at a temperature of 800° C. or less for 5 minutes or less.

Under such conditions, it is possible to perform more precise control such that the thickness of the oxide film which is formed on the surface of the SiC jig fall within a desired range.

Advantageous Effects of Invention

With the silicon wafer heat treatment method of the present invention, it is possible to prevent release of carbon from the SiC jig itself. As a result, it is possible to prevent carbon contamination of the silicon wafer. This makes it possible to eliminate the cause of a device operating failure. Moreover, since a thick oxide film is not formed on the front surface of the silicon wafer, there is no need for removal of the oxide film and a polishing process.

DESCRIPTION OF EMBODIMENTS

Hereinafter, the present invention will be described in more detail.

As described earlier, a silicon wafer heat treatment method that can prevent carbon contamination is required.

Thus, the inventors of the present invention studied a method for suppressing carbon generation itself from a source of carbon contamination. As a result, the inventors have found out that the use of a SiC jig and an (a transfer chamber) environment in which a silicon wafer is taken out of something affects the amount of carbon of a heat-treated wafer surface layer.

Based on the above findings, the inventors have found out that, by forming a dense ultrathin oxidation top coat on the surface of the SiC jig, it is possible to prevent release of carbon from the SiC jig itself and thereby prevent carbon contamination of a silicon wafer and completed the present invention.

Hereinafter, a silicon wafer heat treatment method of the present invention will be described in detail with reference to the drawings as an example of an embodiment, but the present invention is not limited thereto.

Figure 1:
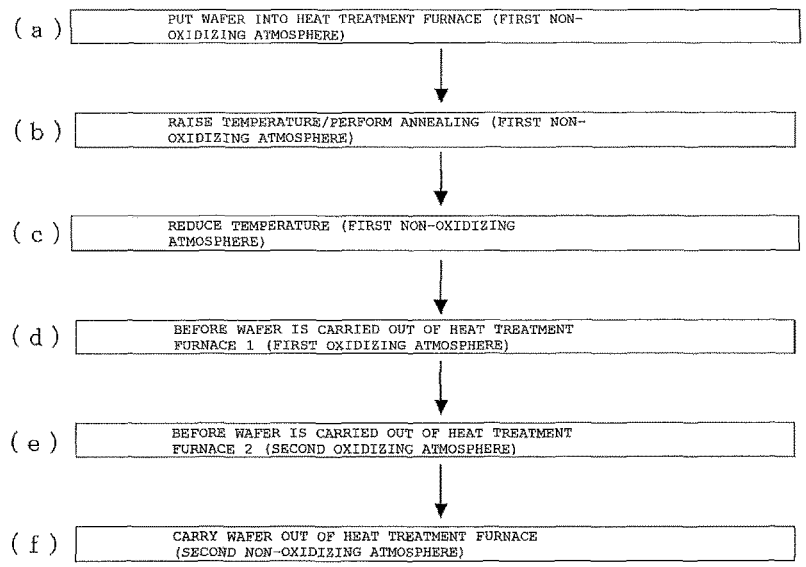
FIG. 1 is a flow diagram of a silicon wafer heat treatment method of the present invention.
Figure 2:
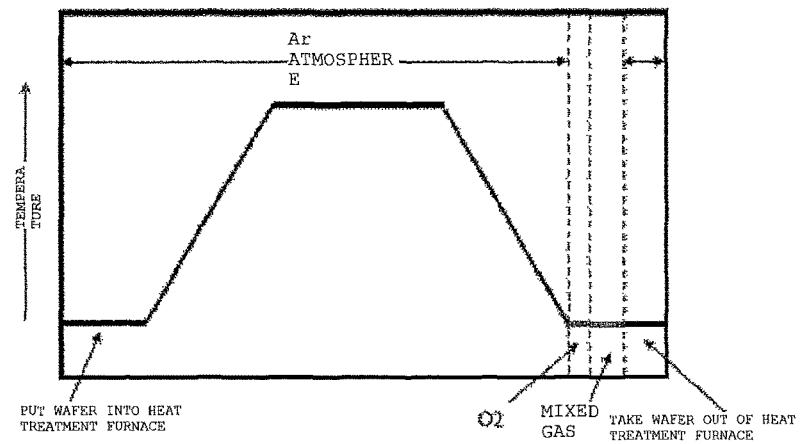
FIG. 2 is a graph depicting an example of the temperature profile of the silicon wafer heat treatment method of the present invention.

FIG. 1 is a flow diagram of the silicon wafer heat treatment method of the present invention. FIG. 2 is a graph depicting an example of the temperature profile of the silicon wafer heat treatment method of the present invention.

First, as depicted in process (a) of FIG. 1, after pre-heat treatment cleaning of a silicon wafer is performed, the silicon wafer is placed on a SiC jig and is put into a heat treatment furnace.

Here, the heat treatment furnace is not limited to a particular heat treatment furnace and, for example, a publicly known batch-type heat treatment furnace can be used. Examples of a heat treatment chamber into which the silicon wafer is put include a heat treatment chamber formed of a quartz tube with a slot. The temperature inside the furnace when the silicon wafer is put thereinto is preferably 600 to 800° C.

The SiC jig is a jig (a boat) made of silicon carbide. Examples of the SiC jig include a SiC sintered body and what is obtained by coating the surface of a base made of carbon with SiC.

Next, as depicted in process (b) of FIG. 1, heat treatment of the silicon wafer is performed. First, in a first non-oxidizing atmosphere, the temperature of the heat treatment furnace is raised. The rate of temperature rise is not limited to a particular rate, but 3 to 10° C./min, for example, is preferable. After the completion of the temperature rise, holding is performed at a fixed temperature. As the holding temperature, 1100 to 1200° C., for example, is preferable, and, as the holding time, 1 minute to 1 hour is preferable. By performing such heat treatment, it is possible to perform modification such as eliminating COPs on a silicon wafer surface layer.

Then, as depicted in process (c) of FIG. 1, the temperature is reduced to a temperature at which the silicon wafer can be carried out of the heat treatment furnace with the silicon wafer kept in the first non-oxidizing atmosphere. The rate of temperature reduction is not limited to a particular rate, but 1 to 5° C./min, for example, is preferable. As the temperature at which the silicon wafer can be carried out of the heat treatment furnace, 600 to 800° C., for example, is preferable.

Examples of gas used to change the atmosphere to the first non-oxidizing atmosphere include hydrogen, nitrogen, argon, helium, and a mixed atmosphere selected from them. As the first non-oxidizing atmosphere, a 100% argon atmosphere is particularly preferable.

Next, as depicted in process (d) of FIG. 1, after the temperature is reduced to the temperature at which the silicon wafer can be carried out of the heat treatment furnace, before the wafer is taken out of the quartz tube, the first non-oxidizing atmosphere is switched to an atmosphere containing oxygen, and an oxide film having a thickness of 1 to 10 nm is formed on the surface of the SiC jig in the atmosphere containing oxygen.

The formation of the oxide film proceeds in accordance with, for example, the following equation:

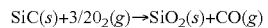

$$SiC(s)+3/2O_2(g) \rightarrow SiO_2(s)+CO(g)$$

By setting the thickness of the oxide film which is formed on the surface of the SiC jig at 1 to 10 nm, it is possible to prevent carbon contamination of the silicon wafer. As the thickness of the oxide film which is formed on the surface of the SiC jig, 2 to 8 nm is particularly preferable. If the thickness of the oxide film is less than 1 nm, there is a possibility that carbon contamination (contamination at a carbon concentration of $1 \times 10^{16}$ atoms/cm$^3$ or more at measurement values by a SIMS) occurs on the silicon wafer front surface because the oxide film is not formed on the whole surface. If heat treatment by which the thickness of the oxide film exceeds 10 nm is performed, as a result of $SiC+3/2O_2 \rightarrow SiO_2+CO$ at the formation of the oxide film, a large amount of CO gas is generated from the SiC jig and the carbon concentration on the wafer front surface is increased. Moreover, a thick oxide film is formed on the silicon wafer front surface. In addition, if such a thick oxide film is formed on the surface of the SiC jig, in argon heat treatment of the next batch, a small amount of oxygen gas is generated and roughening appears on the silicon wafer front surface by an etching action, and haze undesirably occurs.

Moreover, at this time, the atmosphere containing oxygen may comprise the first atmosphere containing oxygen, as depicted in process (e) of FIG. 1, a second atmosphere containing oxygen, the second atmosphere whose oxygen partial pressure is lower than the oxygen partial pressure of the first atmosphere containing oxygen, the first atmosphere containing oxygen is changed into the second atmosphere containing oxygen. Here, the formation of the oxide film can be performed in the first atmosphere containing oxygen under heat treatment conditions: at a temperature of 800° C. or less for 5 minutes or less. Then, it is preferable to perform holding in the second atmosphere containing oxygen under heat treatment conditions: at a temperature of 800° C. or less for 10 minutes or less.

As the first atmosphere containing oxygen, for example, the oxygen concentration is preferably 50 to 100%, and a 100% oxygen atmosphere is particularly preferable. In such a high partial pressure oxygen environment, it is possible to form a dense ultrathin oxidation top coat having a thickness of 1 to 10 nm on the surface of the SiC jig in a short time. Moreover, by adopting the heat treatment conditions: at a temperature of 800° C. or less for 5 minutes or less, preferably, heat treatment conditions: at a temperature of 600 ° C. or more but 800° C. or less for 0.3 minute or more but 5 minutes or less, it is possible to form a uniform oxide film on the surface of the SiC jig and control the thickness of an oxide film to be formed more precisely.

As the second atmosphere containing oxygen, it is preferable that the atmosphere is, for example, a mixed gas of $N_2$ and $O_2$ and the oxygen concentration is 0.1 to 20%, and a 0.6% oxygen atmosphere is particularly preferable. It is preferable to perform, after an ultrathin oxide film is formed in the first atmosphere containing oxygen, holding in such a low partial pressure oxygen environment under heat treatment conditions: at a temperature of 800° C. or less for 10 minutes or less, preferably, heat treatment conditions: at a temperature of 600 ° C. or more but 800° C. or less for 1 minute or more but 10 minutes or less because this prevents volatilization of the ultrathin oxide film formed on the surface of the SiC jig and makes the ultrathin oxide film less likely to come off.

By forming the oxide film on the surface of the SiC jig in a short time in the high partial pressure oxygen environment in the manner described above, even when oxygen, carbon, and a carbonation product adhere to the surface of the SiC jig in a transfer chamber with low partial pressure oxygen, the presence of the oxide film makes a reaction with the SiC jig less likely to occur. Moreover, by increasing the oxygen partial pressure, a passive oxidation reaction occurs. At this time, a $SiO_2$ film formed on the surface of the SiC jig has higher resistance to etching than a natural oxide film (a SiOx film) during a heat treatment process in a non-oxidizing atmosphere (an argon atmosphere) in the next batch. As a result, it is possible to prevent carbon of the SiC jig itself from being released from the oxide film. This makes it possible to control the amount of carbon contamination of the silicon wafer so as to be $1 \times 10^{16}$ atoms/cm$^3$ or less.

Figure 3:
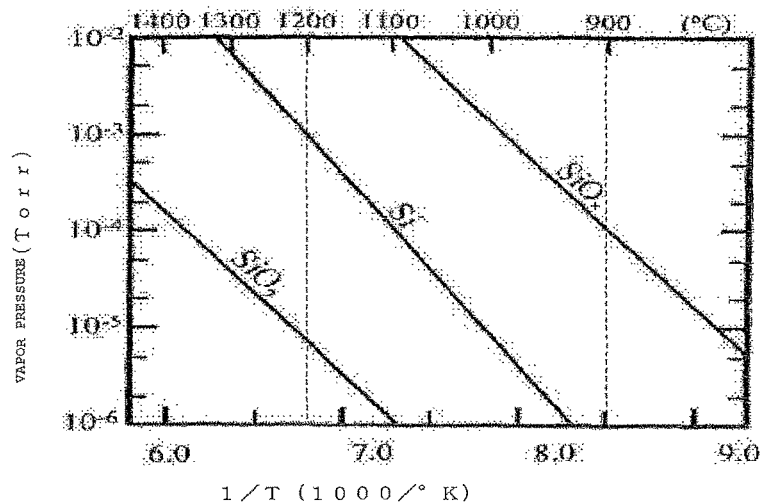
FIG. 3 is a diagram depicting the relationship between the temperature and the vapor pressure of each of $SiO_2$, SiOx, and Si.

FIG. 3 is a diagram depicting the relationship between the temperature and the vapor pressure of each of $SiO_2$, SiOx, and Si. The vertical axis represents the logarithmic value (Torr) of vapor pressure and the horizontal axis represents the reciprocal of the temperature (1000/° K). As depicted in FIG. 3, when the temperature is fixed, since the vapor pressure of $SiO_2$ is lower than the vapor pressure of SiOx, $SiO_2$ is less likely to evaporate; as a result, the resistance of the surface of the oxide film (the dense ultrathin oxidation top coat which is formed of $SiO_2$ on the surface of the SiC jig) to etching is increased.

On the other hand, the size of a gap between the $SiO_2$/SiC layers is 0.2 nm or more, and oxygen molecules that diffuse in the $SiO_2$/SiC layers combine with Si atoms at the interface of the $SiO_2$ layer and carbon atoms at the interface of the SiC layer and become dissociated. The oxidized carbon atoms become dissociated from the interface of the SiC layer as $CO_2$ molecules and CO molecules by thermal agitation and diffuse in the $SiO_2$ layer ($SiC(s)+3/2O_2(g) \rightarrow SiO_2(s)+CO(g)$). However, if the heat treatment temperature is low (for example, 800° C. or less) and oxygen is supplied for a short time, it is possible to suppress the amount of oxygen that diffuses at the $SiO_2$/SiC interface and reduce the generation of a carbonation product in the next heat treatment batch.

After holding in the second atmosphere containing oxygen in process (e) is performed, as depicted in process (f) of FIG. 1, the atmosphere is switched to the second non-oxidizing atmosphere and the silicon wafer is carried out of the heat treatment furnace in the second non-oxidizing atmosphere. Examples of gas used to change the atmosphere to the second non-oxidizing atmosphere include those that are used in the first non-oxidizing atmosphere described above. As the second non-oxidizing atmosphere, a 100% argon atmosphere is particularly preferable. The temperature when the silicon wafer is carried out of the heat treatment furnace is preferably 600 to 800° C.

As described above, by controlling the thickness of the oxide film of the SiC jig so as to become a thickness that does not completely evaporate and disappear in heat treatment in a high-temperature argon atmosphere in the next batch, the silicon wafer heat treatment method of the present invention can prevent carbon from being released from the SiC jig itself in high-temperature argon heat treatment in the next heat treatment batch and prevent the occurrence of haze caused by roughening of the surface of the silicon wafer. In addition, it is possible to prevent carbon contamination of the silicon wafer in the heat reduction process and the formation of a thick oxide film on the wafer front surface. Furthermore, when a new SiC jig with the surface on which an oxide film is not formed is used, by forming an oxide film having a thickness of 1 to 10 nm in advance on the surface of the SiC jig by heat treatment which is performed on a dummy wafer or the like, it is possible to prevent reliably carbon contamination in performing heat treatment on a silicon wafer which is a product. By using such a method of the present invention, as compared to an existing heat treatment method that controls the thickness of an oxide film of a wafer, carbon contamination of a silicon wafer can be further reduced.

EXAMPLES

Hereinafter, the present invention will be described more specifically with Example and Comparative Example, but the present invention is not limited by these examples.

Example

A nitrogen-doped P-type silicon wafer having a diameter of 300 mm (specific resistance: 8 to 12 acm, oxygen concentration: 15 ppma (JEIDA (Japan Electronic Industry Development Association Standards)), nitrogen concentration $5 \times 10^{13}$ atoms/cm$^3$) was prepared. After pre-heat treatment cleaning was performed on this wafer, the wafer was placed on the SiC jig and was put into the heat treatment furnace at 700° C. The temperature was raised to 1200° C., heat treatment by which holding was performed for 1 hour was performed, and the temperature was reduced to 700° C. The temperature rise, holding, and temperature reduction were performed in a 100% argon atmosphere. Then, the 100% argon atmosphere was switched to a 100% oxygen atmosphere, oxygen was supplied for 30 seconds, the atmosphere was switched to the 100% argon atmosphere after purging was performed in a 0.6% oxygen atmosphere for about 10 minutes, and the wafer was taken out thereof in the 100% argon atmosphere.

By so doing, an oxide film of about 1.2 nm was formed on the SiC jig. At this time, a uniform oxide film (about 2 nm) was formed on the wafer front surface and haze did not occur. Moreover, at this time, since the oxide film on the wafer front surface is thin, the oxide film removal process as that in Patent Literature 1 is not necessary.

(Carbon Concentration Analysis)

Figure 4:
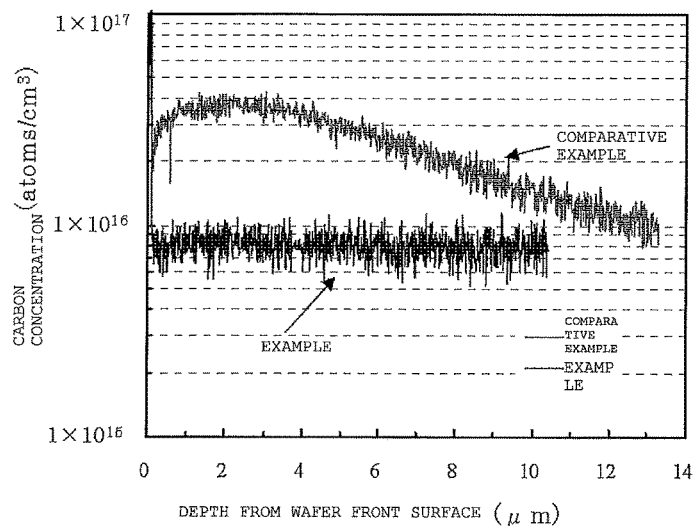
FIG. 4 is a diagram depicting the results of the carbon concentration profiles of Example and Comparative Example.

Carbon concentration analysis was conducted on Example described above and Comparative Example on which the processes from a process of putting a wafer into the furnace to a process of carrying the wafer out thereof were performed under the same conditions as Example except that all the processes were performed in an argon atmosphere. FIG. 4 is a diagram depicting the results of carbon concentration profiles (indicating the level of carbon contamination of a wafer surface layer measured by a SIMS) of Example and Comparative Example. The vertical axis of FIG. 4 represents the carbon concentration (atoms/cm$^3$) of a surface layer of a silicon wafer and the horizontal axis represents the depth (pm) from the wafer front surface.

While, in Comparative Example (the existing annealed wafer), carbon of $4 \times 10^{16}$ atoms/cm$^3$ was detected at the highest carbon concentration, in Example (the silicon wafer on which short-time oxygen atmosphere treatment was performed), carbon was significantly reduced nearly to a detection limit ($7 \times 10^{15}$ atoms/cm$^3$) or below. This is thought to be caused by suppression of outward diffusion of carbon from the SiC jig into the atmosphere during the heat treatment in the argon atmosphere.

Figure 5:
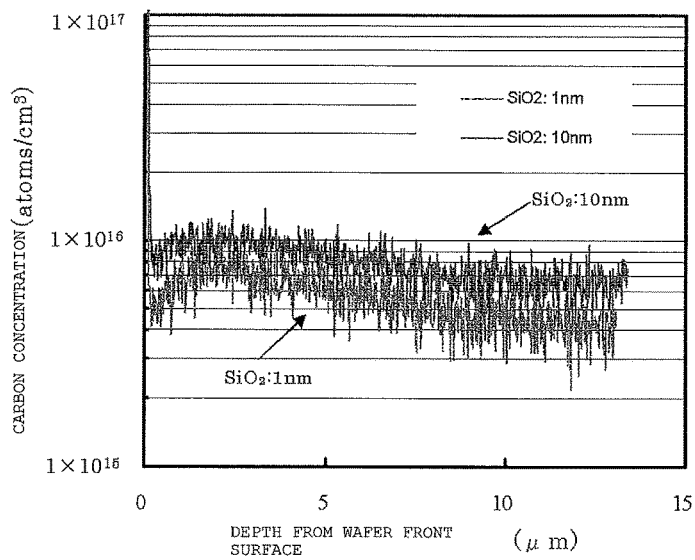
FIG. 5 is a graph depicting the relationship between the depth from the wafer front surface and the carbon concentration of a wafer surface layer observed when a SiC jig with a 1-nm or 10-nm oxide film formed thereon is used.
Figure 6:
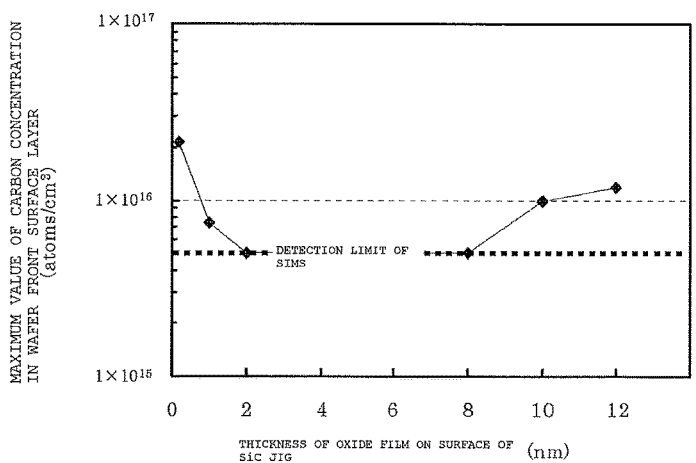
FIG. 6 is a graph depicting the relationship between the thickness (nm) of an oxide film on the surface of the SiC jig and the maximum value of the carbon concentration in a wafer front surface layer.

Moreover, the thickness of an oxide film which is formed on the surface of the SiC jig was varied by changing the time at which switching to an oxygen atmosphere was performed in the conditions of Example, and the amount of carbon contamination of the wafer front surface in the next heat treatment batch was measured by a SIMS as depicted in FIGS. 5 and 6.

FIG. 5 is a graph depicting the relationship between the depth from the wafer front surface and the carbon concentration of a wafer surface layer observed when a SiC jig with a 1-nm or 10-nm oxide film formed thereon is used. The vertical axis of FIG. 5 represents the carbon concentration (atoms/cm$^3$) of a surface layer of a silicon wafer and the horizontal axis represents the depth (pm) from the wafer front surface. FIG. 6 is a graph depicting the relationship between the thickness (nm) of an oxide film on the surface of the SiC jig and the maximum value of the carbon concentration (atoms/cm$^3$) in a wafer front surface layer. The vertical axis of FIG. 6 represents the maximum value of the carbon concentration (atoms/cm$^3$) in a wafer front surface layer and the horizontal axis represents the thickness (nm) of an oxide film on the surface of the SiC jig.

As depicted in FIG. 5, if the thickness of the oxide film is 1 to 10 nm, it is possible to prevent carbon contamination. As depicted in FIG. 6, if the oxide film became thinner than 1 nm, since a dense oxide film was not formed on the whole surface, carbon contamination at $1 \times 10^{16}$ atoms/cm$^3$ or more occurred on the wafer front surface. On the other hand, when the oxide film was thicker than 10 nm, carbon contamination at $1 \times 10^{16}$ atoms/cm$^3$ or more was observed.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A silicon wafer heat treatment method comprising:
   placing a silicon wafer on a SiC jig and putting the silicon wafer into a heat treatment furnace;
   performing heat treatment on the silicon wafer in the heat treatment furnace in a first non-oxidizing atmosphere;
   reducing a temperature to a temperature at which the silicon wafer can be carried out of the heat treatment furnace; and
   carrying the silicon wafer out of the heat treatment furnace,
   wherein
   in the heat reduction step, after the temperature is reduced to the temperature at which the silicon wafer can be carried out of the heat treatment furnace, the first non-oxidizing atmosphere is switched to an atmosphere containing oxygen, an oxide film having a thickness of 1 to 10 nm is formed on a surface of the SiC jig in the atmosphere containing oxygen, and the atmosphere containing oxygen is then switched to a second non-oxidizing atmosphere.

2. The silicon wafer heat treatment method according to claim 1, wherein
   the atmosphere containing oxygen comprises a first atmosphere containing oxygen and a second atmosphere containing oxygen, the second atmosphere whose oxygen partial pressure is lower than an oxygen partial pressure of the first atmosphere containing oxygen, the first atmosphere containing oxygen is changed into the second atmosphere containing oxygen.

3. The silicon wafer heat treatment method according to claim 2, wherein
   formation of the oxide film is performed in the first atmosphere containing oxygen under heat treatment conditions: at a temperature of 800° C. or less for 5 minutes or less.

* * * * *